United States Patent
Fifield et al.

(10) Patent No.: US 6,667,633 B2
(45) Date of Patent: Dec. 23, 2003

(54) MULTIPLE FINGER OFF CHIP DRIVER (OCD) WITH SINGLE LEVEL TRANSLATOR

(75) Inventors: John A. Fifield, Underhill, VT (US); Wolfgang Hokenmaier, Burlington, VT (US)

(73) Assignees: International Business Machines Corporation, Armonk, NY (US); Infineon Technologies North America Corporation, San Jose, CA (US)

(*) Notice: Subject to any disclaimer, the term of this patent is extended or adjusted under 35 U.S.C. 154(b) by 0 days.

(21) Appl. No.: 10/093,784

(22) Filed: Mar. 7, 2002

(65) Prior Publication Data

US 2003/0169069 A1 Sep. 11, 2003

(51) Int. Cl.$^7$ ............................................ H03K 19/003
(52) U.S. Cl. .............................. 326/30; 326/26; 326/32; 326/87
(58) Field of Search ............................ 326/30, 26, 27, 326/31–34, 68, 80, 81, 82, 83, 87

(56) References Cited

U.S. PATENT DOCUMENTS

| 5,862,390 A | * | 1/1999 | Ranjan ................ 395/750.01 |
| 6,452,428 B1 | * | 9/2002 | Mooney et al. ............ 327/108 |
| 6,549,062 B1 | * | 4/2003 | Washburn et al. .......... 327/513 |

* cited by examiner

Primary Examiner—Anh Tran
(74) Attorney, Agent, or Firm—McGuireWoods LLP; H. Daniel Schnurmann (57) ABSTRACT

A multiple finger off chip driver (OCD) has a single level translator for each of a plurality of PFET fingers and NFET fingers which allow the impedance of the OCD to be varied to match the impedance of a driven load. A plurality of PFET and NFET finger selection devices are used to select various combinations of output FETS and ballast resistor finger combinations to drive an output signal at a desired impedance level. The ballast resistors are scaled in ohmic value to the size of the output finger it is connected to. In this configuration, a constant ratio of FET impedance to ballast resistance is maintained in each drive stage (finger). By selecting various combinations of fingers various driver impedances can be selected.

20 Claims, 6 Drawing Sheets

MULTIPLE FINGER OFF CHIP DRIVER (OCD) WITH SINGLE LEVEL TRANSLATOR

BACKGROUND OF THE INVENTION

1. Field of the Invention

The present invention generally relates to off chip driver (OCD) circuits and, more particularly, to programmable variable impedance OCD circuits.

2. Description of the Related Art

In electrical systems, output drivers are used to drive input/output (I/O) devices or similar loads. In order to have efficient power transfer it is important that the impedance of the driver closely match the impedance of the load; the load comprising the impedance of the driven device as well as the impedance of the transmission line. Each output driver is set up with a certain voltage/impedance that matches the strength of the transmission line and I/O device being driven by that specific driver. Thus, I/O devices with a low drive strength would need an output driver with a high impedance, and high strength I/O devices require a low impedance driver. Since each output driver typically has only one impedance rating, an output driver driving a load other than the one it is designed for would result in too much or too little of the strength needed.

High performance output driver circuits require careful control of both current switching and output impedance characteristics. The former requirement, commonly referred to as dI/dt control, requires switching the driver on over a specified period of time, or switching multiple stages of the driver on in sequence. Such output current control techniques are necessary to minimize the on-chip inductive noise which occurs due to the large current requirements of the output driver circuits during switching. The driver impedance requirements result in "programmable impedance" drivers whose output resistance is varied using complicated digital controls. This impedance matching is necessary to avoid signal degradations due to bus reflections at high frequencies, where the output data bus acts as a transmission line.

As product cycle times decrease, the current control and programmable impedance design points for an output driver must be carefully considered to avoid limiting the performance of the driver. Variable impedance OCDs have become necessary as I/O bus architectures evolve from 66 MHZ single data rate (SDR) to 133 MHZ and higher double data rate (DDR) systems.

Simple prior art programmable impedance OCDs simply involved placing several fixed impedance off-chip drivers in parallel where each driver is commonly referred to in the art as a "finger". By enabling or disabling a selected number of fingers, usually with a control word, the combined impedance of the OCD varies. Several inefficiencies exist with this approach, such as the need for multiple Level Translators (LT) for data signals and control. For one thing, driver impedance needs to change incrementally from a control word and span over a wide impedance range. Further, impedance linearity over Vdq is difficult to preserve depending on the number of fingers selected. An ideal output driver having Vdq linearity would have the impedance characteristics of a resistor. That is, the current it supplies or sinks would be directly proportional to the voltage across the DQ output pin. In such an ideal driver, Vdq=Rdq*Idq. However, practical prior art output drivers are constructed from transistors, which have a linear and saturated range of operation. When the output transistor is biased in the linear region, the DQ current and voltage characteristics are substantially linear. However, at the edges of this linear range the transistor begins to saturate and current does not change proportionally with voltage, and output impedance rises orders of magnitude. It is therefore desirable for an OCD to have a predictably small percentage change in impedance over its range of Vdq, hence a high degree of linearity. It is also desirable to have this percentage change in impedance constant, independent of the numbers of fingers selected. In other words, if a 2% change in impedance occurs with a 7-ohm setting, a 2% change is preferred for a 17-ohm setting.

SUMMARY OF THE INVENTION

The present invention is directed to a multiple finger off chip driver (OCD) having a single level translator for each of a plurality of PFET fingers and NFET fingers which allow the impedance of the OCD to be varied to match the impedance of a driven load. A VSS-VDD level DATAIN input signal is supplied to both a PFET level translator (shifter) and an NFET level translator. The PFET level translator translates the DATAIN signal to a VDDQ level and the NFET level translator translates the DATAIN signal to a VSSQ level. The level translators can comprise either a single stage or dual stages. In the single stage DATAIN is stored in a first latch formed by PFET pull-up devices and NFET pull-down devices where the NFETs are sized to over power the PFETs. Hence, a DATAIN signal at a 1-volt high level is translated to a 3-volt VDDQ level because the drains of the PFETs are at 3 volt VDDQ. A TRIP input signal performs an enable function which must be at a logical low-level for the latch to accept DATAIN. The dual stage translator works much the same way as the single level translator described above to translate the VDD=1-volt DATAIN level to 3-volt VDDQ level. In addition, a VSS ground level is then translated to VSSQ ground level though a second latch such that the ouptu signal is referenced between VSSQ and VDDQ levels.

A plurality of PFET and NFET finger selection devices may be used to select various combinations of output FETS and ballast resistor finger combinations to drive the VDDQ-VSSQ output signal at a desired impedance level. The ballast resistors are scaled in ohmic value to the size of the output finger it is connected to. In this configuration, a constant ratio of FET impedance (as a function of FET width) to ballast resistance is maintained in each drive stage (finger). By selecting various combinations of fingers various driver impedances can be selected.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
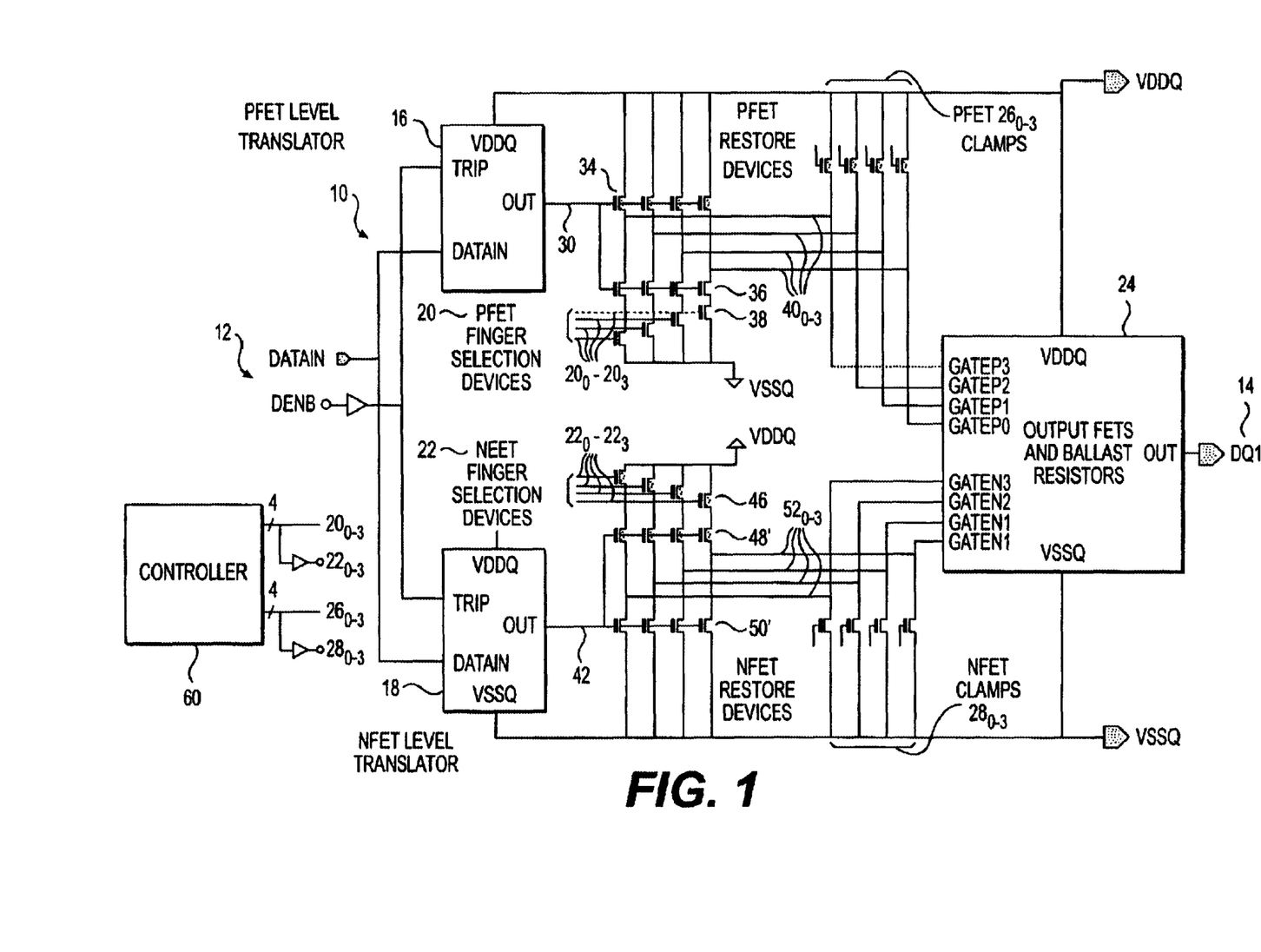
FIG. 1 is a circuit schematic of the programmable off-chip driver (OCD) circuit according to the present invention.

Referring now to the drawings, and more particularly to FIG. 1, there is shown a circuit schematic of the programmable off-chip driver (OCD) circuit according to the present invention generally referred to with reference numeral 10. The OCD 10 translates a data signal DATAIN 12 to an output drive signal DQ 14 having a desired impedance characteristic. Since the input signal DATAIN 12 typically has a logic voltage level different than that recognized by the device to be driven, level translators (shifters) are required. Here, a pair of level translators are used comprising a PFET level translator 16 and an NFET level translator 18. For example, the logic levels of the input signal DATAIN 12 may be relative to VDD and ground, where VDD represents a logic "1" at 1.9 volts. This needs to be translated to a logic signal relative to VDDQ and ground, where VDDQ represents a logic "1" at 3.3 volts. Details of the PFET level translator 16 and an NFET level translator 18 are given with reference to FIGS. 3 and 4, respectively.

Still referring to FIG. 1, the output 30 of the PFET level translator 16 supplies a signal to common gate nodes of a plurality of PFET restore devices 34. As shown, there are four PFET restore devices 34, one for each pull-up finger connected between VDDQ and the PFET gate lines $40_{0-3}$. The output 14, is held in tristate by holding the PFET gates, lines $40_{0-3}$ at VDDQ, and by holding NFET gates $52_{0-3}$ at VSSQ. When the level translators 16 and 18 are held in tristate position by tristate signal TRIP, the PFET level translator 16 outputs a VSS signal on line 30. This enables PFET restore devices 34, and drives PFET gate lines $40_{0-3}$ to VDDQ. Similarly, in tristate condition NFET level translator 18 outputs a VDDQ level which enables NFET restore devices 50 and drives NFET gate lines $52_{0-3}$ to VSSQ.

In an active operation TRIP signal is deactivated and DATAIN signal is translated to VDDQ for '1' data type or to VSSQ level for a '0' data type on lines 30 and 42 respectively. PFET finger selection lines $20_{0-3}$ and NFET finger selection lines $22_{0-3}$ are enabled or disabled for a desired pull-up and pull-down output impedance. With a high state on a PFET selection device 38, a PFET gate $40_{0-3}$ will be connected to VSS when level translator output line 30 is at VDDQ through pull-down device 36. An enabled PFET finger in Output FET/Ballast resistor group 24 drives output signal DQ 14, to VDDQ.

In a similar manner NFET selection lines $22_{0-3}$ are enabled or disabled for a desired pull-down impedance, and when NFET level translator outputs a VSSQ level on line 42, a selected NFET gate line $52_{0-3}$ is enabled via device 46 as it is connected to VDDQ through pull-up device 48. Selected NFET fingers in OUTPUT FETs 24 drive the DQ output 14 to VSSQ. When FET selection lines 20 and 22 are in their disabled state this would leave corresponding PFET gate lines 40 and NFET gate lines 52 floating with neither a restore path or an enable path conducting. Floating nodes are unpredictable so to insure operability and reliability, PFET clamps 26 and NFET clamps 28 are also decoded with signals $20_{0-3}$ and $22_{0-3}$ respectively to clamp an unused output gate 40 or 52 to its proper tristate level.

Figure 2:
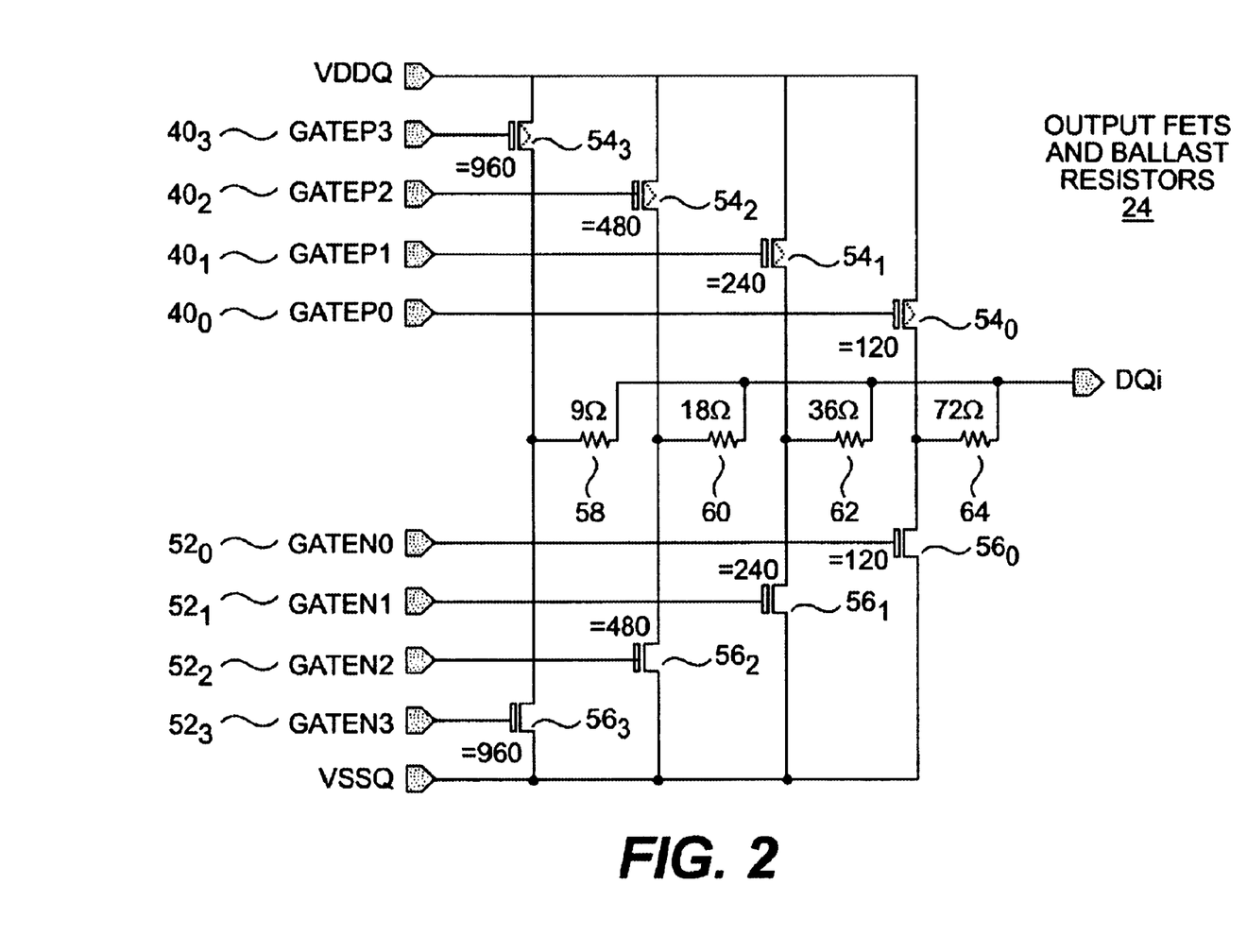
FIG. 2 is a circuit diagram of the output FETs and Ballast Resistor circuit.

FIG. 2 is a circuit diagram of the output FETs and ballast resistor circuit 24. The ballast resistors (58, 60, 62, and 64) are scaled in ohmic value to the size of the output finger it is connected to. For example, in FIG. 2, 72 Ω, 36 Ω, 18 Ω, and 9 Ω resistors are connected to the four output NFET/PFET pairs, $56_{0-3}$ and $54_{0-3}$, respectively. It is a feature of this invention to pair an output device with a predetermined drive strength, or nominal-linear impedance with a resistor which is a predetermined fraction of that nominal-linear FET impedance. In this configuration, a constant ratio of FET impedance to ballast resistance is maintained in each drive stage (finger). Specifically, in this example, the FET impedance to ballast resistor is a constant value (i.e., FET width*resistor value=constant). In this example, the product is 8640 as shown in the table below:

| FET WIDTH (μm) | x Resistor Value (Ω) | =Constant |
|---|---|---|
| 960 | 9 | 8640 |
| 480 | 18 | 8640 |
| 240 | 36 | 8640 |
| 120 | 72 | 8640 |

Of course the above is by way of example only and many other combinations of FET impedances, resistor values, and product constants may be chosen.

It is desirable to proportion the size of the output fingers (and their corresponding ballast resistor) in a binary progression. This allows impedance selection over a wide range and provides a substantially constant change in impedance per step of change.

In the preferred embodiment, four sets of NFET pull-down and PFET pull-up devices are scaled in a binary progression of strength with each having a proportional ballast resistor. With ballast resistor values of 9, 18, 36 and 72 ohms, the output impedance of this driver can be easily changed between 12-ohms to 100-ohms.

Figure 3:
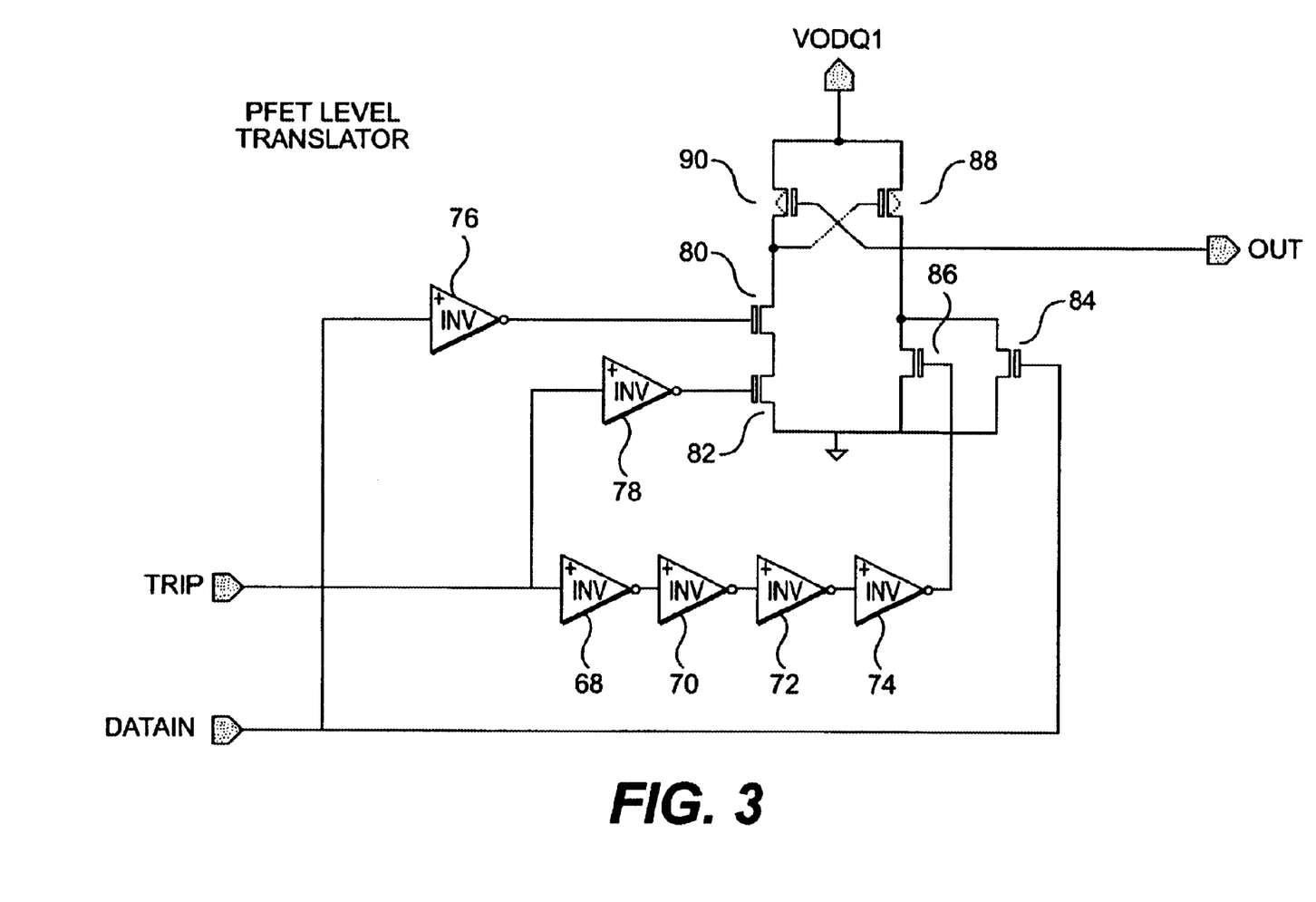
FIG. 3 is a is a circuit diagram of the PFET level translators.

FIG. 3 is a circuit diagram of the PFET level translators 16. Incoming signal DATAIN is a data signal swinging between VSS and VDD of say 1-volt. DATAIN is stored in the latch formed by PFET devices 88 and 90, and pull-down NFETs 80, 82, 84 and 86. The NFET pull down devices are sized adequately to over power the PFET pull up devices 88 and 90. Hence, a DATAIN signal at a 1-volt high level is translated to a 3-volt VDDQ level because the drains of the PFETs are at 3-volt VDDQ. The TRIP input performs an enable function which must be at a logical low-level for the latch to accept DATAIN. Inverters 68, 70, 72 and 74 form a delay chain to delay the latch reset to enhance data-hold time if necessary. Inverters 76 and 78 are used to alter the polarity of the input signals for the complement side of the latch. While the PFET translator 16 shown in FIG. 3 has been illustrated as a single stage, it is understood that it could also be implemented as a 2-stage level translator as described below for the case of the NFET level translator 18.

Figure 4:
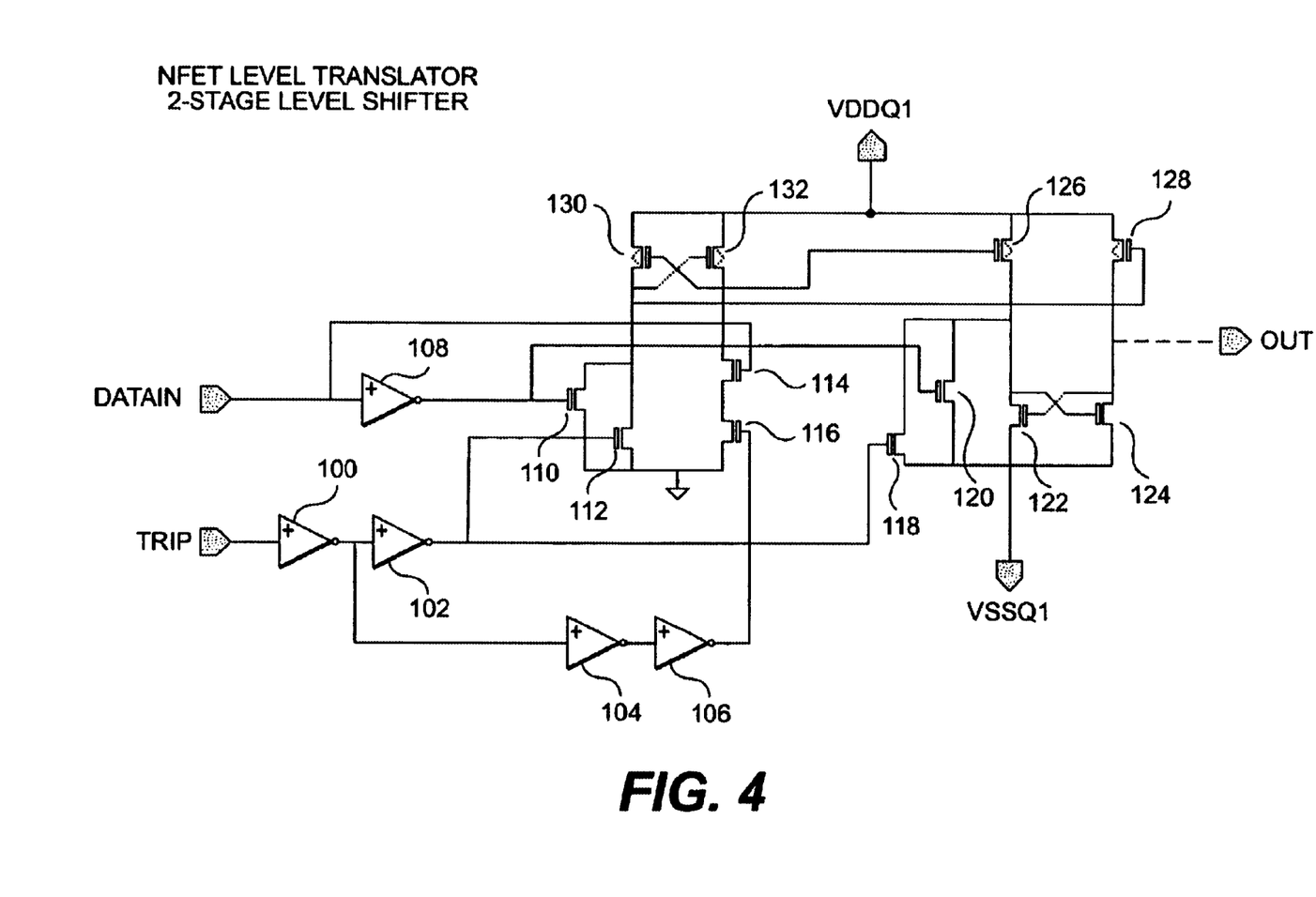
FIG. 4 is a diagram of the NFET level translators.

FIG. 4 is a 2-stage NFET level translator 18. A first latch is formed by FETS 130, 132, 110, 112, 114 and 116, with inverters 100, 102, 104, 106 and 108 works much the same way as the single level translator described above to translate the VDD=1-volt DATAIN level to 3-volt VDDQ level. Next, the VSS ground level is translated to VSSQ ground level through the second latch formed by FETs 126, 128, 118, 120, 122 and 124. With NFET devices 122 and 124 sources at VSSQ the logical low level gets translated to VSSQ. Output signal OUT is now referenced between VSSQ and VDDQ levels.

In this system of two latches, the gate level of the controlling inputs are referenced to the source level of the latch control devices. In the first latch, signal DATAIN is referenced to VSS as are the sources of NFET control devices 110, 112, 116 and 114. In the second latch, the PFET control devices 126 and 128 have gate-to-source voltage referenced to VDDQ. Hence, when a control device is in its off bias condition, noise on its source supply is also common to the gate level and is rejected as common-mode noise. FETs 118 and 120 are used as speed-up devices to enhance the response to DATAIN and TRIP inputs. This direct coupling between the primary inputs DATAIN and TRIP to the second latch enhances response time because the propagation delay through the first latch is circumvented.

Figure 5:
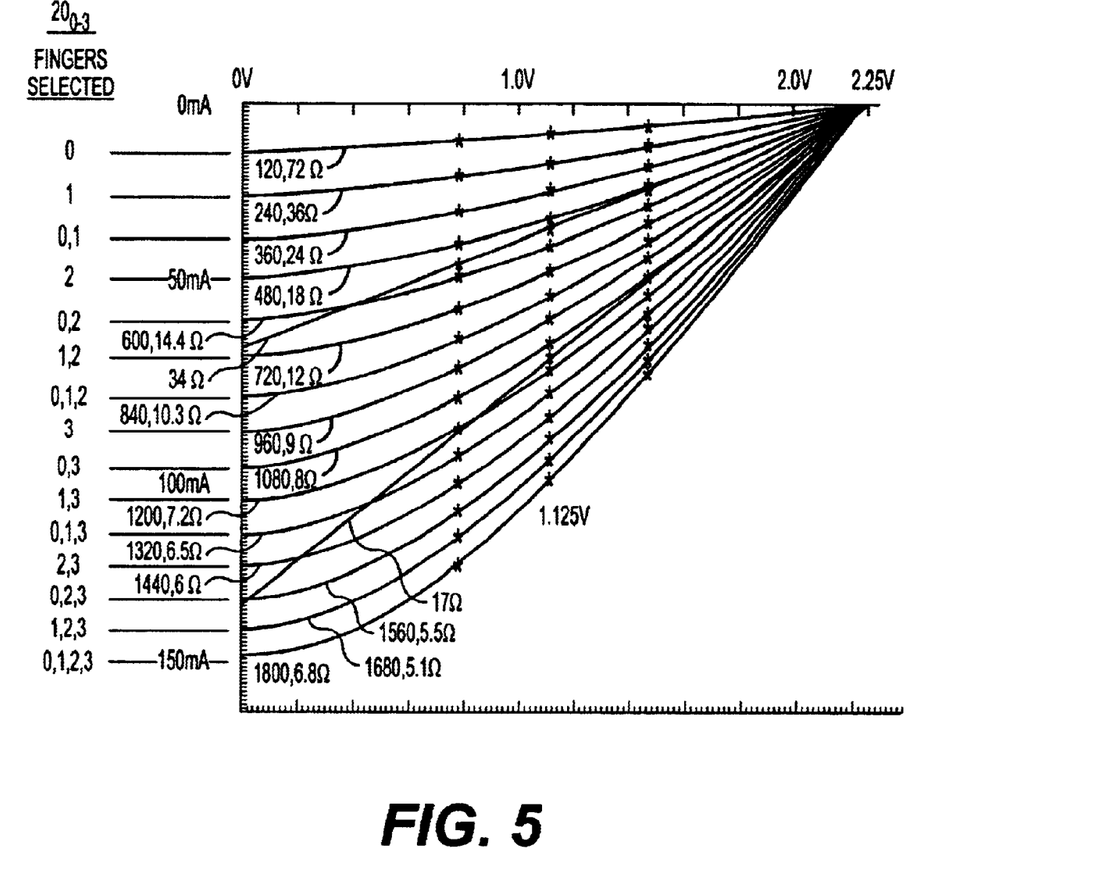
FIG. 5 is a diagram showing OCD PFET impedance curves for the various combination of finger selections.

FIG. 5 is a diagram showing the PFET I/V impedance curves according to the invention for the example when VDDQ=2.25 volts. By selecting various combinations of fingers ($20_{1-3}$ from FIG. 1) various driver impedances can be selected. The fifteen (15) possible finger selections are shown in the diagram plotted against exemplary 17 Ω and 34 Ω target curves. Taken in conjunction with the FIG. 2, the values on the left side of the diagram indicate the sum of the selected FET impedances ($54_{1-3}$) combined with the sum of the associated ballast resistors (58–64) added in parallel. For example, if PFET finger (0) is selected, the associated I/V curve is influenced by the FET impedance 120 and a ballast resistor value of 72 Ω. If for example, PFET fingers (0, 1, 2, 3) are selected, the associated curve is influenced by FET impedances expressed as a function of FET width (120 $\mu$m+240+480+960=1800 $\mu$m) combined with ballast resistors (72∥36∥18∥9=4.8 Ω). So for example, if the OCD was to have an output impedance of 17 Ω, PFET fingers (0, 3) would be selected since between 1.25 V and 2.25 volts fingers (0, 3) best approximates 17 Ω. Similarly, if the OCD was to have an output impedance of 34 Ω, PFET finger (2) would be selected since between 1.25 V and 2.25 volts finger (2) best approximates 34 Ω.

Figure 6:
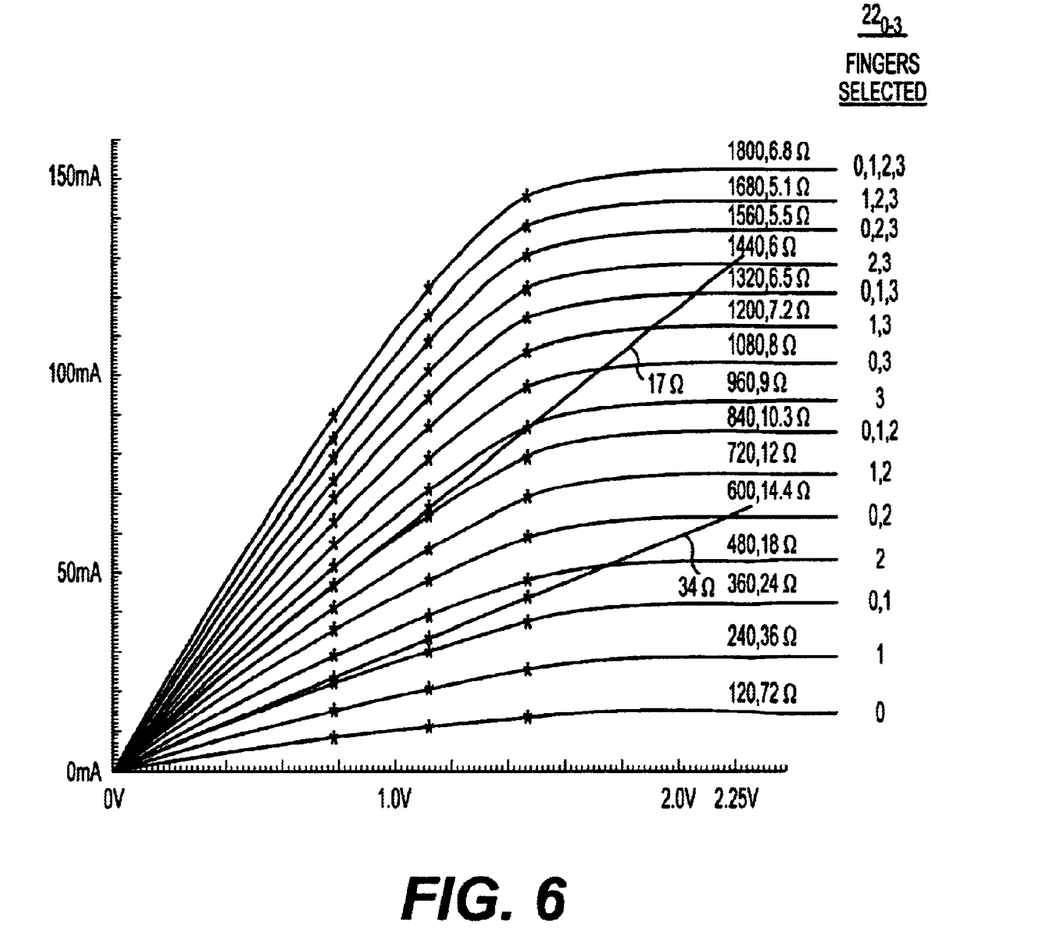
FIG. 6 is a diagram showing OCD NFET impedance curves for the various combination of finger selections.

FIG. 6 is a diagram showing the NFET I/V impedance curves when VDDQ=2.25 volts, similar to above. By selecting various combinations of fingers ($22_{1-3}$ from FIG. 1) various driver impedances can be selected. The fifteen (15) possible finger selections are shown also plotted against exemplary 17 Ω and 34 Ω target curves. Taken in conjunction with the FIG. 2, the values on the left side of the diagram indicate the sum of the selected FET impedances ($56_{1-3}$) combined with the sum of the associated ballast resistors (58–64) added in parallel just as above for the case of the PFET I/V impedance curves. For example, if NFET finger (0) is selected, the associated I/V curve is influenced by the FET impedance 120 and a ballast resistor value of 72 Ω. If NFET fingers (0, 1, 2, 3) are selected, the associated curve is influenced by FET impedances (120 $\mu$m+240+480+960=1800 $\mu$m) combined with ballast resistors (72∥36∥18∥9=4.8 Ω). So for example, if the OCD was to have an output impedance of 17 Ω, PFET fingers (0, 1, 2) would be selected since between 0 volts and 1.25 volts fingers (0, 1, 2) best approximates 17 Ω. Similarly, if the OCD was to have an output impedance of 34 Ω, PFET fingers (0, 1) would be selected since between 0 volts and 1.25 volts fingers (0, 1) best approximates 34 Ω.

While the invention has been described in terms of a single preferred embodiment, those skilled in the art will recognize that the invention can be practiced with modification within the spirit and scope of the appended claims.

We claim:

1. An off chip driver device with adjustable output impedance, comprising:
   a plurality of fingers for receiving an input data signal;
   a plurality of finger selection devices each for selecting a corresponding finger; and
   an output circuit comprising a transistor and a ballast resistor for each of said plurality of fingers, wherein said ballast resistor has a value inversely proportional to an impedance value of said transistor for each of said plurality of fingers.

2. An off chip driver device with adjustable output impedance as recited in claim 1, wherein a multiplication product of said ballast resistor value and said impedance value of said transistor is a constant value for each of said plurality of fingers.

3. An off chip driver device with adjustable output impedance as recited in claim 2, wherein selecting combinations of said plurality of fingers changes an output impedance of said off chip driver.

4. An off chip driver device with adjustable output impedance as recited in claim 2, wherein said plurality of fingers comprise a set of PFET fingers and a corresponding set of NFET fingers.

5. An off chip driver device with adjustable output impedance as recited in claim 4, further comprising:
   a single PFET level translator for translating said input data signal from a first voltage level to a second voltage level for said set of PFET fingers; and
   a single NFET level translator for translating said input data signal rrom said first voltage level to a third voltage level.

6. An off chip driver device with adjustable output impedance as recited in claim 1, wherein said single PFET level translator comprises a single latch circuit.

7. An off chip driver device with adjustable output impedance as recited in claim 1, wherein said single PFET level translator comprises a dual latch circuit.

8. An off chip driver device with adjustable output impedance as recited in claim 1, wherein said single NFET level translator comprises a single latch circuit.

9. An off chip driver device with adjustable output impedance as recited in claim 1, wherein said single NFET level translator comprises a dual latch circuit.

10. An off chip driver device with adjustable output impedance, comprising:
    a plurality of pull-up fingers, each comprising a first type transistor switching in a corresponding ballast resistor;
    a plurality of pull-down fingers comprising a second type switching transistor switching in said corresponding ballast resistors;
    wherein said ballast resistors for each pull-up and pull-down finger are scaled inversely proportional to the strength of said corresponding first type switching device and said second type switching device and have a constant ratio for all fingers.

11. An off chip driver device with adjustable output impedance as recited in claim 10, wherein said pull-up fingers and said pull-down fingers are scaled according to a binary weighting.

12. An off chip driver device with adjustable output impedance as recited in claim 10, wherein an output voltage is greater than the voltage of an input signal to said off chip driver.

13. The off chip driver as recited in claim 12, further comprising:
    a first level translator for translating a voltage level of the input signal for said plurality of pull-up fingers; and
    a second level translator for translating said voltage level of the input signal for said plurality of pull-down fingers.

14. The off chip driver as recited in claim 10, wherein each of said first level translator and said second level translators comprises at least one latch.

15. The off chip driver as recited in claim 10 further comprising a clamping circuit for clamping unselected fingers.

16. An off chip driver device with adjustable output impedance, comprising:
- a PFET level translator and an NFET level translator for translating a voltage level of an input signal;
- a plurality of PFET finger restore devices receiving an output from said PFET level translator;
- a plurality of NFET finger restore devices receiving an output from said NFET level translator;
- a plurality of PFET finger selection devices for selecting one or more PFET fingers;
- a plurality of NFET finger selection devices for selecting one or more NFET fingers;
- clamps for clamping unselected PFET fingers and unselected NFET fingers; and
- an output stage comprising a plurality of output fingers each comprising:
  - a PFET being selected by a corresponding one of said PFET finger selection devices, and
  - an NFET being selected by a corresponding one of said NFET finger selection devices; and
  - a ballast resistor connected at a first end between said PFET and said NFET and at a second end to an output terminal of said off chip driver device, wherein a value of said ballast resistor has an inverse relationship to an impedance value of said PFET and said NFET.

17. An off chip driver device with adjustable output impedance as recited in claim 16, wherein a multiplication product of said impedance value of either of said NFET and said PFET with said ballast resistor value is identical for all of said plurality of output fingers.

18. An off chip driver device with adjustable output impedance as recited in claim 16, wherein said PFET level translator comprises at least one latch.

19. An off chip driver device with adjustable output impedance as recited in claim 16, wherein said NFET level translator comprises at least one latch.

20. An off chip driver device with adjustable output impedance as recited in claim 16, wherein said NFET level translator comprises two latches.

* * * * *